(12) United States Patent
Fu et al.

(10) Patent No.: US 10,996,801 B2
(45) Date of Patent: May 4, 2021

(54) CAPACITIVE TOUCH DETECTING DEVICE CAPABLE OF SELF-CALIBRATION

(71) Applicant: REALTEK SEMICONDUCTOR CORPORATION, Hsinchu (TW)

(72) Inventors: Huye Fu, Suzhou (CN); Jian Dong, Suzhou (CN); Zuohui Peng, Suzhou (CN); Yuxiang Qi, Suzhou (CN); Fengqiao Ye, Suzhou (CN)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 0 days.

(21) Appl. No.: 16/726,414

(22) Filed: Dec. 24, 2019

(65) Prior Publication Data

US 2020/0241665 A1 Jul. 30, 2020

(30) Foreign Application Priority Data

Jan. 25, 2019 (CN) .......................... 201910071243.7

(51) Int. Cl.
*G06F 3/044* (2006.01)
*G01R 27/26* (2006.01)
*G06F 3/041* (2006.01)

(52) U.S. Cl.
CPC ......... *G06F 3/044* (2013.01); *G01R 27/2605* (2013.01); *G06F 3/04166* (2019.05)

(58) Field of Classification Search
CPC ............. G01R 27/2605; G06F 3/04166; G06F 3/0418; G06F 3/044
See application file for complete search history.

(56) References Cited

U.S. PATENT DOCUMENTS 8,481,873 B2 7/2013 Osoinach et al.
2011/0073384 A1* 3/2011 Osoinach .............. G06F 3/0416
178/18.06

(Continued)

FOREIGN PATENT DOCUMENTS

CN 103607187 A 2/2014
CN 103323675 B 8/2014

(Continued)

OTHER PUBLICATIONS

OA letter of counterpart TW application of application No. 108106903 dated May 29, 2019. Summary of TW OA letter: claims 1, 3-5, and 8-10 are rejected as being unpatentable over the cited reference 1 (U.S. Pat. No. 8,481,873 B2).

*Primary Examiner* — Chun-Nan Lin
(74) *Attorney, Agent, or Firm* — WPAT, PC

(57) ABSTRACT

Disclosed is a capacitive touch detecting device including a sampler circuit and a detection-and-calibration circuit. The sampler circuit executes the following steps: charging a capacitor when the level of a clock signal is high, wherein the capacitor's capacitance is a first capacitance provided a touch event occurs and is a second capacitance provided the touch event doesn't occur, the first capacitance is greater than the second capacitance and related to a parasitic capacitance and a touch capacitance, and the second capacitance is unrelated to the touch capacitance; sampling a voltage determined by the capacitor during the level transition of the clock signal to generate a sample value; and discharging the capacitor when the level of the clock signal is low. The detection-and-calibration circuit determines whether the touch event occurs and whether at least one parameter needs to be updated according to the sample value and at least one parameter.

5 Claims, 7 Drawing Sheets

(56) References Cited

U.S. PATENT DOCUMENTS

| | | | | |
|---|---|---|---|---|
| 2013/0120309 A1* | 5/2013 | Mo | ................. | G06F 3/04166 345/174 |
| 2013/0307821 A1* | 11/2013 | Kogo | ................. | G06F 3/044 345/174 |
| 2015/0015538 A1* | 1/2015 | Tanaka | ................. | G06F 3/0443 345/174 |
| 2015/0279297 A1* | 10/2015 | Nakano | ................. | G09G 3/3614 345/173 |
| 2017/0038868 A1* | 2/2017 | Tai | ................. | G06F 3/0418 |
| 2018/0181255 A1* | 6/2018 | Nomura | ................. | G06F 3/0416 |
| 2019/0079124 A1* | 3/2019 | Jiang | ................. | G06F 3/0445 |
| 2019/0113574 A1* | 4/2019 | Iwamoto | ................. | G01R 31/3277 |
| 2019/0272056 A1* | 9/2019 | Wang | ................. | G01R 27/2605 |

FOREIGN PATENT DOCUMENTS

| | | |
|---|---|---|
| CN | 102495701 B | 12/2014 |
| CN | 105067022 A | 11/2015 |
| CN | 107786193 A | 3/2018 |
| CN | 107820570 A | 3/2018 |

\* cited by examiner

CAPACITIVE TOUCH DETECTING DEVICE CAPABLE OF SELF-CALIBRATION

BACKGROUND OF THE INVENTION

1. Field of the Invention

The present invention relates to a touch detecting device, especially to a capacitive touch detecting device.

2. Description of Related Art

The manufacture of capacitive touch pads is usually realized by printing touch pads on a PCB (printed circuit board). According to the type of PCB material, a touch pad on the PCB in conjunction with the surrounding ground signals or ground plane form a parasitic capacitance $C_P$. When no touch event occurs, the parasitic capacitance is called a baseline capacitance. When the touch pad is touched by a human hand or something, the electrical field of the touch pad is changed due to the touch, and the capacitance of the touch pad is changed as well. The capacitance caused by the touch is called a touch capacitance $C_F$. Therefore, the total capacitance $C_S$ of the touch pad during occurrence of the touch will be $C_S=C_P+C_F$. The capacitive touch detection is realized by detecting the change of the total capacitance of a touch pad.

There are many detecting methods for detecting the variation in the capacitance of a touch pad. The methods include: using relaxation oscillator; obtaining the charging current of a touch pad by outputting a voltage pulse to the touch pad; using tri-frequency continuous scanning; and using differential scanning. The methods of using the relaxation oscillation and outputting the voltage pulse are based on techniques of charging and/or discharging a capacitor, and weak in anti-interference; furthermore, the methods may also have the problems of high power consumption, large circuit area, and high hardware cost. In addition, a touch pad exposed to the outside is subject to environmental factors and noise interference, but the current methods merely obtain an initial value of the actual capacitance of a touch pad as a fixed basic value of the touch pad (i.e., the value of the baseline capacitance) during the initialization of an IC; since the actual capacitance of the touch pad varies with time due to the change of interference, the fixed basic value may be inaccurate. As to the tri-frequency continuous scanning or differential scanning, although these methods make efforts in reducing noise interference to increase the signal-to-noise ratio, the problems are complicated structure and large circuit area, which not only increases the power consumption but also increases the cost of manufacture.

SUMMARY OF THE INVENTION

An object of the present invention is to provide a capacitive touch detecting device aiming at preventing the problems of the prior art.

An embodiment of the capacitive touch detecting device is capable of self-calibration and includes a clock provider, a sampler circuit, a detection-and-calibration circuit, and a control circuit. The clock provider is configured to provide a clock signal. The sampler circuit is configured to execute the following steps according to the clock signal: charging a capacitor when a level of the clock signal is a first level, wherein the capacitor is electrically coupled to one of touch pads, a capacitance of the capacitor is a first capacitance when a touch event occurs and the capacitance of the capacitor is a second capacitance when no touch event occurs, the first capacitance is greater than the second capacitance and related to a parasitic capacitance and a touch capacitance, and the second capacitance is unrelated to the touch capacitance; sampling a capacitive voltage determined by the capacitor during a level transition of the clock signal to generate a sample value, wherein the clock signal changes from the first level to a second level during the level transition of the clock signal; and discharging the capacitor when the level of the clock signal is the second level. The detection-and-calibration circuit is configured to determine whether a touch condition is fulfilled according to the sample value and accordingly determine whether the touch event occurs, and the detection-and-calibration circuit is also configured to determine whether a calibration condition is fulfilled according to the sample value and accordingly determine whether at least one parameter needs to be calibrated, wherein the at least one parameter includes at least one of the following: a current setting value of a charging current for charging the capacitor; a capacitive setting value of the parasitic capacitance (e.g., the value of a baseline capacitance); at least one setting value of the touch condition (e.g., a touch threshold, and a threshold for measuring the difference between a sample value and the value of baseline capacitance); and at least one setting value of the calibration condition (e.g., upward noise threshold and downward noise threshold). The control circuit is configured to control the operation of the clock provider, the sampler circuit, and the detection-and-calibration circuit.

Another embodiment of the capacitive touch detecting device includes a clock provider, a sampler circuit, a detection circuit, and a control circuit. The clock provider is configured to provide a clock signal. The sampler circuit is configured to execute the following steps according to the clock signal: charging a capacitor when a level of the clock signal is a first level, wherein the capacitor is electrically coupled to one of touch pads, a capacitance of the capacitor is a first capacitance when a touch event occurs and the capacitance of the capacitor is a second capacitance when no touch event occurs, the first capacitance is greater than the second capacitance and related to a parasitic capacitance and a touch capacitance, and the second capacitance is unrelated to the touch capacitance; sampling a capacitive voltage determined by the capacitor during a level transition of the clock signal to generate a sample value, wherein the clock signal changes from the first level to a second level during the level transition of the clock signal; and discharging the capacitor when the level of the clock signal is the second level. The detection circuit is configured to determine whether a touch condition is fulfilled according to the sample value and accordingly determine whether the touch event occurs. The control circuit is configured to control the operation of the clock provider, the sampler circuit, and the detection circuit.

These and other objectives of the present invention will no doubt become obvious to those of ordinary skill in the art after reading the following detailed description of the preferred embodiments that are illustrated in the various figures and drawings.

DETAILED DESCRIPTION OF THE PREFERRED EMBODIMENTS

Figure 1:
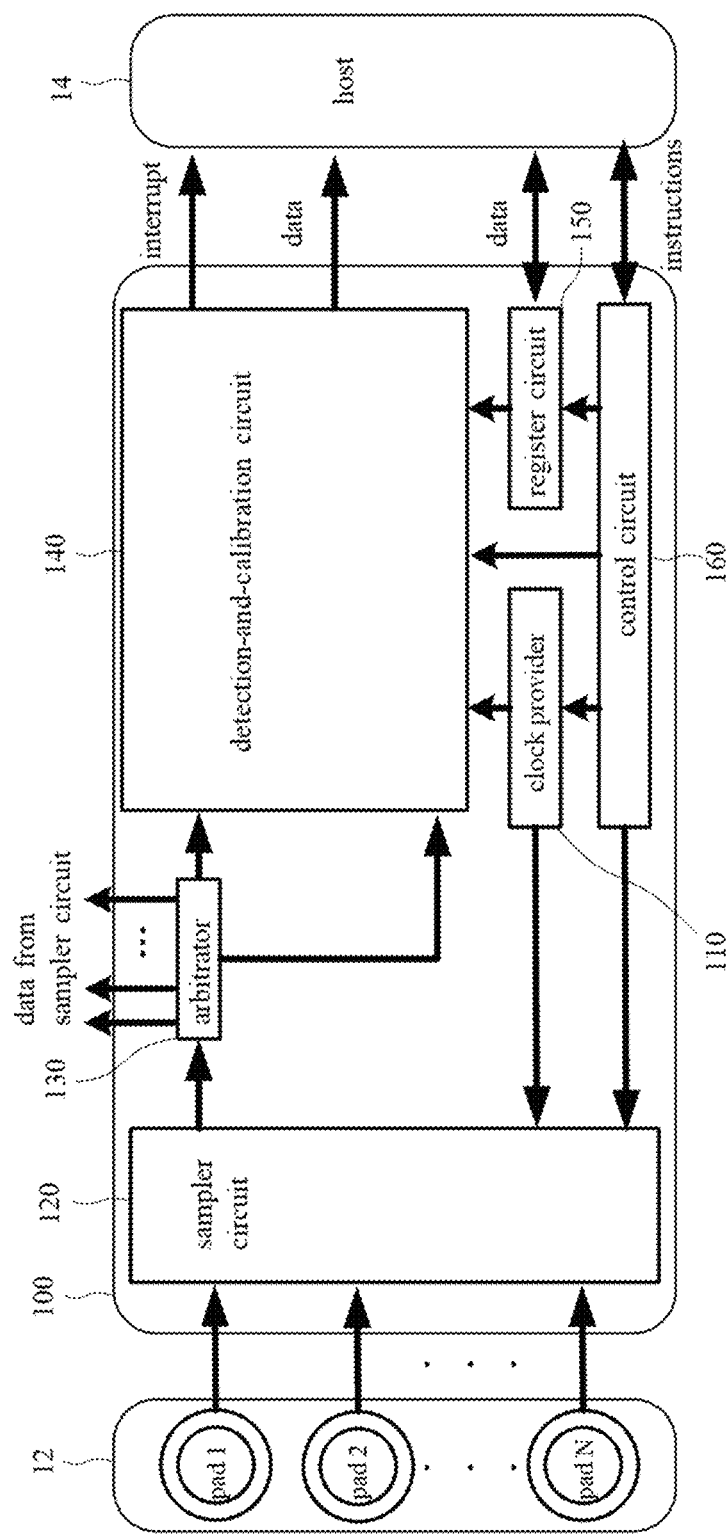
FIG. 1 shows an embodiment of the capacitive touch detecting device of the present disclosure.

The present disclosure includes a capacitive touch detecting device with/without self-calibration. This capacitive touch detecting device operates in a pipeline sampling manner according to a clock signal which could be a low frequency clock signal (e.g., a clock signal having a frequency between 100 KHz-300 KHz). The capacitive touch detecting device executes the following steps every cycle of the clock signal: when the clock signal is at a first level (e.g., a high level), charging the touch capacitor of a touch pad by a current source (e.g., an adjustable current source); sampling the voltage of the touch capacitor by an analog-to-digital converter (ADC) according to the edge (e.g., the falling edge) of the clock signal, and then converting the sample voltage into a digital number so as to allow a detection circuit to determine whether a touch event occurs according to the digital number; and when the clock signal is at a second level (e.g., a low level), discharging the touch capacitor. The digital number of the same touch pad is relatively constant providing the cycle of the clock signal is fixed; when a touch pad is touched by a hand, the capacitance of a capacitor related to the touch pad increases, the voltage caused by charging the capacitor in a fixed charging period decreases, and thus the digital number corresponding to the voltage decreases. Accordingly, the touch detection of the capacitive touch detecting device is realized by processing data that are generated in the pipeline sampling manner many times.

Compared with the technique using a relaxation oscillation and the technique measuring a charging current, the touch detection of the present disclosure executes charging and discharging processes periodically many times in the pipeline sampling manner and thereby effectively reduces the noise related to an operation-frequency or makes the status of a touch capacitor quickly return to zero potential to lower the influence of the above-mentioned noise. Since the capacitive touch detecting device of the present disclosure discharges the touch capacitor every cycle of the clock signal, the capacitive touch detecting device can prevent the accumulation of noise and thereby improve the capability of anti-noise.

The capacitive touch detecting device can optionally use a noise monitoring circuit and a self-calibrating circuit to automatically monitor the variation in environmental factors (e.g., temperature, humidity) and in the capacitance of touch pads caused by noise, and automatically calibrate at least one of setting values such as the basic capacitance values of touch pads (i.e., the values of baseline capacitances), a touch threshold, a noise threshold, and a charging current. Compared with the prior arts, the capacitive touch detecting device can greatly resist the interference from environmental noise, restrain the electromagnetic interference from the circuit/chip of the capacitive touch detecting device, and restrain the interference from power noise.

The capacitive touch detecting device of the present disclosure uses the technique of time-division multiplexing, and can carry out detection for N channels (e.g., two or more channels) by a single analog-to-digital converter (ADC). The detection for each channel merely consumes a current at µA level. In addition, the capacitive touch detecting device of the present disclosure can optionally use an arbitrator to share the ADC with other circuits. Accordingly, compared with the prior art, the capacitive touch detecting device has excellent practicability, high resolution of touch detection, simplified configuration, and low power consumption; furthermore, the capacitive touch detecting device requires a small circuit area and no additional peripheral circuits, and thus the hardware cost is reduced.

The capacitive touch detecting device of the present disclosure is optionally capable of self-calibration. This device can detect the instant change of noise and the signal-to-noise ratio (SNR), and can execute self-calibration according to the change of baseline capacitance caused by environmental noise. The capacitive touch detecting device can optionally calibrate setting values such as parameters, thresholds, and one or more charging currents.

FIG. 1 shows an embodiment of the capacitive touch detecting device of the present disclosure. FIG. 1 includes: N capacitive touch pads 12 that are electrically coupled to a capacitive touch detecting device 100 via N channels; the capacitive touch detecting device 100; and a host 14 (e.g., a personal computer or the like). Each of the host 14 and N capacitive touch pads 12 is known or self-developed and the detail is omitted here. The capacitive touch detecting device 100 includes a clock provider 110, a sampler circuit 120, an arbitrator 130, a detection-and-calibration circuit 140, a register circuit 150, and a control circuit 160. The clock provider 110 is a known or self-developed circuit such as an independent clock source (e.g., a crystal oscillator or an RC oscillator) or a circuit (e.g., a frequency divider) capable of providing a clock signal by processing a source clock signal. The arbitrator 130 (e.g., a switch or multiplexer) can be optionally omitted according to the demand for implementation. The register circuit 150 is a known or self-developed circuit, and can be integrated into the other circuits of the capacitive touch detecting device 100 according to the demand for implementation. The detection-and-calibration circuit 140 may optionally be simplified to be a detection circuit without the calibration function. The N capacitive touch pads 12 are electrically coupled to the sampler circuit 120 which samples the signals of the touch pads 12 for touch detection. The capacitive touch detecting device 100 is electrically coupled to the host 14 and operable to report the result of touch detection, upload/download data, and transmit/receive instructions. The host 14 may include a processor such as an MCU and/or include a display module, but not limited thereto.

In an exemplary implementation, the control circuit 16 is operable to control the frequency of one or more clock signals, control the enablement of the channel of each touch pad 12, control the switch between channels, arrange the timing of circuit operation, enable the functions of circuits (e.g., the reset of baseline capacitance, the calibration of baseline capacitance, the calibration of one or more thresholds, the calibration of one or more charging currents, and the monitoring of noise and SNR), control the sampling of one or more parameters, and determine one or more parameters (e.g., a self-calibration parameter, a self-calibration threshold, the initial value of baseline capacitance of the channel of each touch pad, a touch threshold, a threshold for measuring the difference between a sample value and the value of baseline capacitance, a upward noise threshold, a downward noise threshold, and a charging current); furthermore, the control circuit 16 is responsible for storing results such as the sampling result, the detection result, and the calibration result in a storage circuit (e.g., a first-in-first-output buffer (FIFO)) or the register circuit 150. The threshold and charging current for each of the N channels can be adjusted independently.

Figure 2:
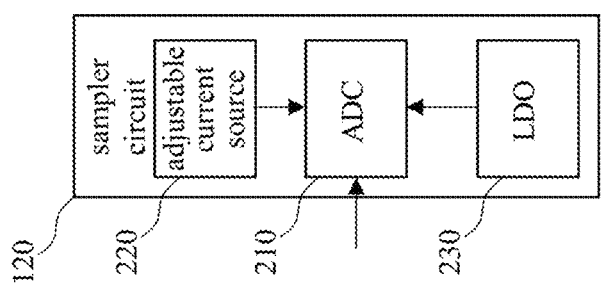
FIG. 2 shows an embodiment of the sampler circuit of FIG. 1.

FIG. 2 shows an embodiment of the sampler circuit 120. As shown in FIG. 1 and FIG. 2, the sampler circuit 120 is a front-end circuit for the capacitive touch detection, and includes an ADC 210, an adjustable current source 220, and an independent low dropout regulator (LDO) 230. According to the clock signal outputted from the clock provider 110, the control circuit 160 controls the sampler circuit 120 to charge the capacitor of each touch pad, sample the voltage of the capacitor, discharge the capacitor, control the timing of circuit operation, and control the switch between the N channels. The ADC 210 functions as a main circuit of the sampler circuit 120 and is powered by the independent LDO 230 that is insulated from the other power sources of the whole system to prevent the influence on the sampling resolution and stability of the ADC 210 caused by the variation in power of the other power sources. The arbitrator 130 is an additional circuit for the capacitive touch detecting device 100, and is operable to make the ADC 210 be a dedicated ADC for touch detection or a normal ADC for other utilization through the technique of time division multiplexing.

Figure 3:
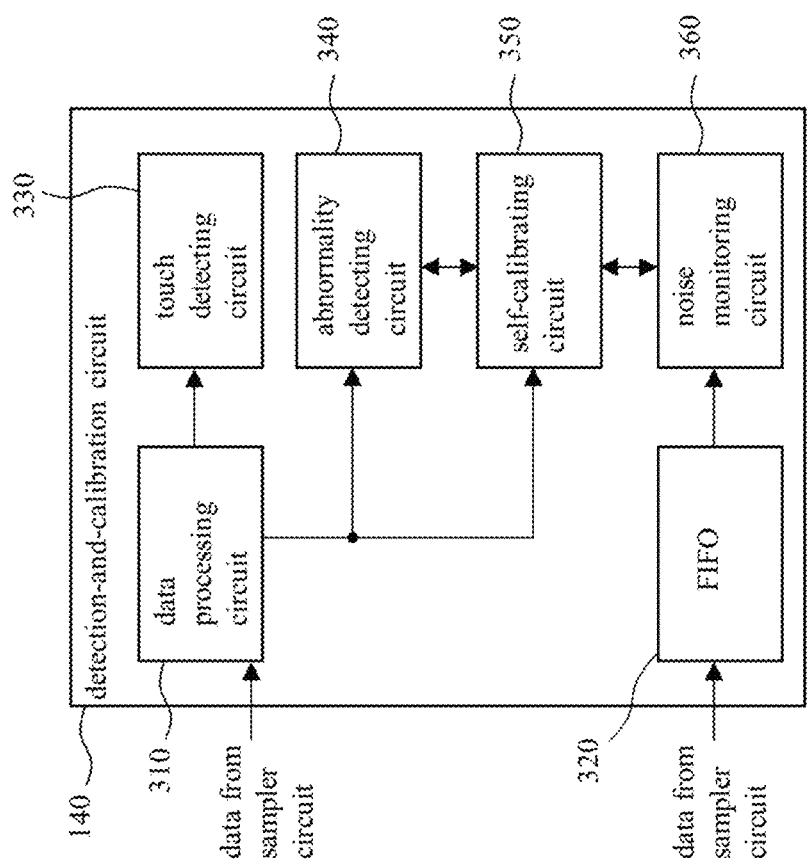
FIG. 3 shows an embodiment of the detection-and-calibration circuit of FIG. 1.

FIG. 3 shows an embodiment of the detection-and-calibration circuit 140. As shown in FIG. 3, the detection-and-calibration circuit 140 includes a known/self-developed data processing circuit 310, a known/self-developed FIFO 320, a touch detecting circuit 330, an abnormality detecting circuit 340, a self-calibrating circuit 350, and a noise monitoring circuit 360. The original sample data of each channel is transmitted to the data processing circuit 310 and the FIFO 320 via the arbitrator 130. The data processing circuit 310 processes the original sample data with a predetermined operation (e.g., a data filtering operation, a weighting and averaging operation, and a subtracting operation), and outputs the absolute value, polarity, etc. of the processing results to the touch detecting circuit 330, the abnormality detecting circuit 340, and the self-calibrating circuit 350 for the execution of touch detection, abnormality detection, and self-calibration of baseline capacitance. During the execution of the sampling process, the sampler circuit 120 transmits the original sample data to the noise monitoring circuit 360 via the arbitrator 130 and the FIFO 320 so that the noise monitoring circuit 360 executes the real-time noise and SNR detection and monitors the influence on the baseline capacitance caused by the environmental factors (e.g., temperature, humidity) and electrical interference (e.g., electromagnetic interference, noise in the supply of power). In addition, the noise monitoring circuit 360 has the self-calibrating circuit 350 execute the self-calibration of the charging current and threshold(s) in accordance with the peak-to-peak value of noise and SNR so as to improve the calibration accuracy of the self-calibrating circuit 350. The real-time or periodical self-calibration can effectively assist the capacitive touch detecting device 100 in resisting the environmental noise.

Figure 4:
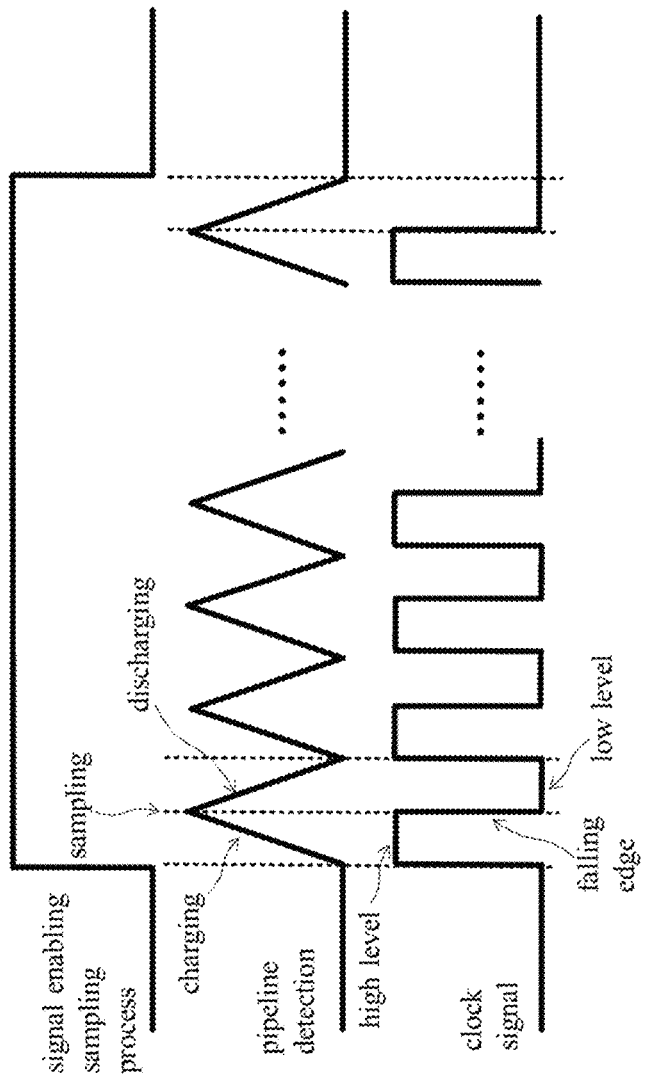
FIG. 4 shows an embodiment of the pipeline sampling of the present disclosure.

The capacitive touch detecting device 100 is operable to execute N-channels detection in the aforementioned pipeline sampling manner. An embodiment of the pipeline sampling manner is shown in FIG. 4. Please refer to FIGS. 1-4; in an exemplary implementation, the features of the pipeline sampling manner include: the control circuit 160 enabling one of the N channels and enabling the sampling function, and finishing the setting of the touch threshold, the threshold for measuring the difference between a sample value and the value of baseline capacitance (hereafter, the differential threshold), the upward and downward noise thresholds, and the charging current. During the enablement of the sampling function, when the clock signal of the clock provider 110 is at a high level, the adjustable current source 220 quickly charges the touch capacitor of a touch pad within a half cycle of the clock signal; when the clock signal is at a transition from the high level to a low level, the ADC 210 samples the voltage of the touch capacitor and converts the sample voltage into a digital value; and when the clock signal is at the low level, the adjustable current source 220 quickly discharges the touch capacitor within another half cycle of the clock signal to make the touch capacitor return to the status of zero potential. The above-mentioned pipeline sampling manner has no need to charge continuously and thereby saves energy; furthermore, the periodical charging and discharging processes are good for resisting the noise interference related to a touch, the operation frequency, or the like; in addition, the periodical discharging process can solve the problem of noise accumulation. In the pipeline sampling manner, when the current of the adjustable current source 220 and the charging time are constant, the variation in the capacitance of the touch capacitor will be proportional to the variation in the sample voltage based on the equation $$I = C\frac{dV}{dt}.$$

The utilization of the ADC 210 (e.g., 12-bit ADC) is helpful to detect a slight variation in capacitance (e.g., 0.1 pF) so that the high sensitivity of the touch pads is realized.

In an exemplary implementation, the features of the pipeline sampling manner further include: sampling data $2^A+B$ (e.g., 2<A<10 and 0<B<5) times in the pipeline sampling manner according to the control of the control circuit 160 during the enablement period of each channel, and then transmitting the original sample data of the ADC 210 to the detection-and-calibration circuit 140 for data processing. The wave of the charging/discharging signal in the pipeline sampling manner could be a sawtooth wave, sine wave, triangle wave, etc., but not limited thereto; in other words, the pipeline sampling manner of FIG. 4 is exemplary for understanding rather than limitation.

In an exemplary implementation, the features of the pipeline sampling manner further include: the sample voltage and the digital value of the ADC 210 obtained by charging the touch capacitor of the same touch pad via the same channel could be different in response to the different setting of the charging current or clock signal. The digital value outputted by the ADC 210 stands for neither the capacitance of the touch capacitor nor the final digital value of the channel. The detection-and-calibration circuit 140 does not pay much attention to the actual capacitance of the touch capacitor, but focuses on the digital value caused by the variation in capacitance so that the detection-and-calibration circuit 140 can not only make determinations according to the amount of the variation but also execute touch detection according to the digital value.

In an exemplary implementation, the features of the pipeline sampling manner further include: the sample voltage and the digital value of the ADC 210 obtained by charging the touch capacitor of the same touch pad via the same channel could be the same due to the same setting of the charging current and clock signal. As explained in the description of related art, when a touch pad is touched by a hand, the touch capacitance $C_F$ is increased and thereby the total capacitance $C_S$ of the touch pad including the touch capacitance $C_F$ and the parasitic capacitance $C_P$ is increased; accordingly, the voltage obtained by charging the touch capacitor of the touch pad with the touch capacitance $C_F$ will be lower than that without the touch capacitance $C_F$, and the digital value outputted by the ADC 210 will be smaller.

Figure 5:
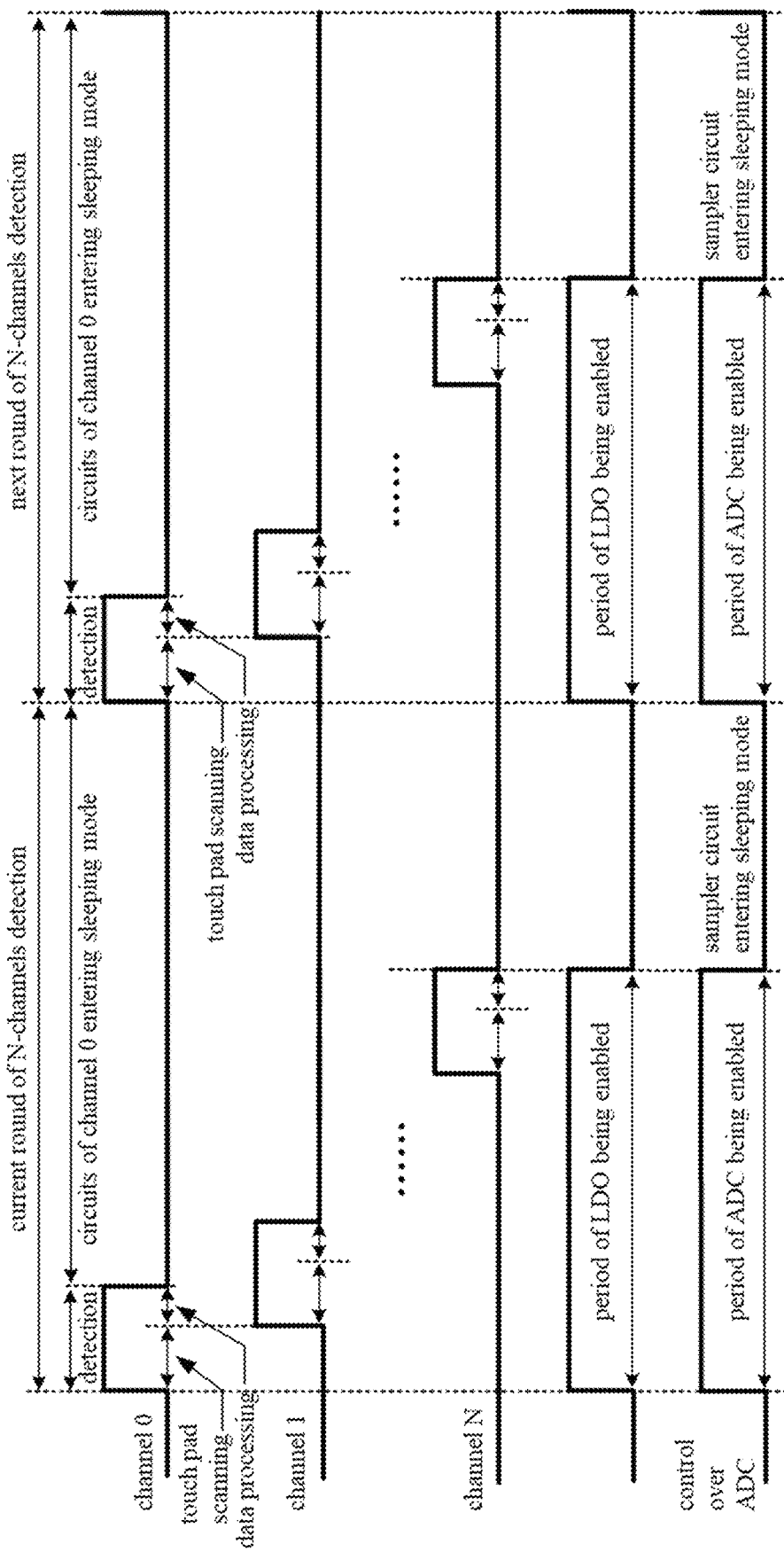
FIG. 5 shows a diagram of an embodiment of N-channels detection.

In an exemplary implementation, the features of the aforementioned N-channels detection include using the time-division multiplexing technique and automatic channel switch technique. After finishing sampling data of a channel, this original sample data is transmitted to the detection-and-calibration circuit 140 for data processing via the arbitrator 130. In the meantime, the control circuit 160 switches the sampler circuit 120 to the next channel for executing the pipeline sampling process; such channel switch is continued till the data of all the N channels are sampled. FIG. 5 shows an embodiment of the N-channels detection and people of ordinary skill in the art can appreciate the detail of this embodiment according to the present disclosure and known techniques. The features of the N-channels detection further includes that the setting for each channel can be set individually and each channel can be enabled individually, and the control circuit 160 can automatically determine the schedule for switching between channels according to the number of enabled channels. For instance, providing the frequency of the clock signal is 200 KHz and the times the sampler circuit 120 sampling the data of each channel is "256+1", it only takes 12 ms to finish scanning ten channels. In an exemplary implementation, the N-channels detection can be executed periodically, and one round of the N-channels detection can be followed by the next round of the N-channels detection immediately or in a predetermined while; after one round of the N-channels detection is finished, the control circuit 160 can optionally rest some or all circuits for the N-channels detection for a predetermined time in a sleeping mode and then start the next round of the N-channels detection. The aforementioned ten channels (i.e., N=10) are exemplary for understanding rather than limitation.

In an exemplary implementation, the features of the touch detection carried out by the capacitive touch detecting device 100 include: setting the sampling parameters (e.g., the cycle of the clock signal for sampling, the times that the sampler circuit 120 executes the sampling operation for each channel, the period of sleep mode, the debouncing times, etc.) and self-calibration parameters in advance; setting the charging current, touch threshold, differential threshold, and upward and downward noise thresholds in advance; and storing the above-mentioned setting in a storage circuit (e.g., ROM, eFUSE, or the register circuit 150), wherein the differential threshold is greater than each of the upward and downward noise thresholds.

Figure 6:
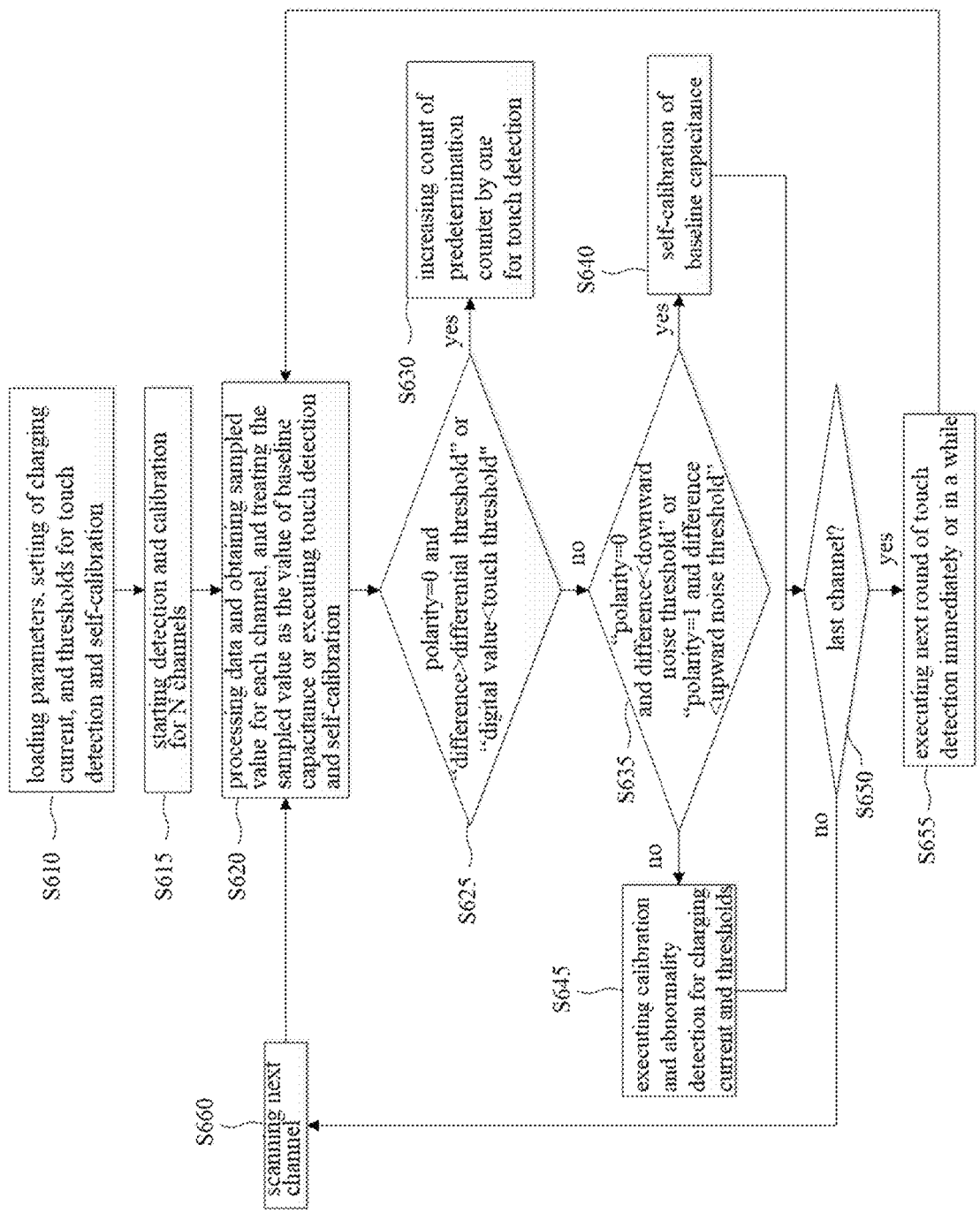
FIG. 6 shows a flowchart of an embodiment of touch detection and self-calibration of baseline capacitance.

FIG. 6 shows a flow chart of an embodiment of the touch detection and self-calibration of baseline capacitance, the flow chart including steps S610~S660. As shown in FIG. 6, when the function of the touch detection is enabled (e.g., when power-on reset), the capacitive touch detecting device 100 is loaded with the sampling parameters and self-calibration parameters, and loaded with the touch detection parameters of each channel to finish the setting for each enabled channel (See step S610). When the sampling process starts (See step S615), the first sampling value of each channel is processed by the data processing circuit 310 and then treated as the initial value of baseline capacitance of each channel. The self-calibrating circuit 359 automatically updates the touch threshold for each channel and starts executing the sampling process, touch detection, self-calibration, and noise monitoring (See step S620).

Please refer to FIG. 6. The procedure for touch detection and self-calibration of baseline capacitance includes the steps below. When the sample value of the ADC 210 is smaller than the touch threshold or when the polarity is labeled "0" (i.e., when the sample value is smaller than the current value of baseline capacitance) and the difference between the sample value and the value of baseline capacitance is greater than the differential threshold (See step S625), the count of a touch predetermination counter (not shown) is increased by one (See step S630); if the condition of increasing the count of the touch predetermination counter is fulfilled this time but unfulfilled next time, the count of the touch predetermination counter is reset to return to an initial number (e.g., zero). When the count of the touch predetermination counter is equal to the setting of debouncing times, an effective touch event is confirmed and reported to a higher level (e.g., the host 14 of FIG. 1) by an interrupt (See step S630); and when the difference between a next sample value and the value of baseline capacitance is smaller than the differential threshold or the sample value is greater than the touch threshold, an effective release event is configured and reported to the higher level with an interrupt. When the polarity is labeled "0" and the difference between the sample value and the value of baseline capacitance is smaller than the downward noise threshold or when the polarity is labeled "1" and the difference between the sample value and the value of baseline capacitance is smaller than the upward noise threshold (See step S635), the self-calibrating circuit 350 automatically executes self-calibration (See step S640). After the processes for a channel are finished (See step S650), a channel switch operation is automatically executed to let a next channel go through the processes including the sampling process, touch detection, self-calibration, and noise monitoring (See step S660); the switch between channels carries on till the processes for every channel in this round of detection are finished; afterwards, a next round of detection can start immediately or after a predetermined interval.

Please refer to FIG. 6. In an exemplary implementation, the self-calibrating circuit 350 executes a self-calibration method (See step S640) alone. The features of the self-calibration method include: the self-calibrating circuit 350 having two adjustable self-calibration parameters (i.e., a self-calibration step value and a self-calibration factor) and executing the auto-calibration of the value of baseline capacitance according to a weighting algorithm embedded in the self-calibrating circuit 350. The self-calibrating circuit 350 obtains the data from the data processing circuit 310 and operates according to the difference between the sample value and the value of baseline capacitance; when the polarity of the difference is labeled "0" and the difference between the sample value and the value of baseline capacitance is smaller than the downward noise threshold or when the polarity of the difference is labeled "1" and the difference between the sample value and the value of baseline capacitance is smaller than the upward noise threshold, the self-calibrating circuit 350 calibrates the value of baseline capacitance. The self-calibrating circuit 350 uses the self-calibration algorithm and the current setting of the self-calibration parameters to perform a weighting process to the difference between the sample value and the value of baseline capacitance; when the difference is greater than the self-calibration factor, the self-calibrating circuit 350 executes an update operation according to the self-calibration step value, in which the update operation could be adding the self-calibration step value to the value of baseline capacitance or subtracting the self-calibration step value from the value of baseline capacitance. If the difference between the sample value and the value of baseline capacitance is smaller than the self-calibration factor, the difference is recorded; this difference and the difference obtained according to the next sampling operation are processed in a weighting manner, and if the current difference is greater than the self-calibration factor, the value of baseline capacitance is updated by a self-calibration step value, and if not, the value of baseline capacitance is kept unchanged and then the current and next differences are processed in the weighting manner. According to the change of the value of baseline capacitance, the self-calibrating circuit 350 updates the touch threshold for each channel synchronously. Since the variation in the environmental factors such as temperate and humidity of a real environment usually changes slightly, processing data in the weighting manner and executing the self-calibration method step by step can have the variation in the baseline capacitance caused by the slow change of the environmental factors be effectively monitored and the value of baseline capacitance be well calibrated. A pulse noise interference won't cause the baseline capacitance to change violently while a violent change will lead to a misjudgement on touch detection or prevent a touch event from being detected. Compared with the prior art, the self-calibration method of the present disclosure can optionally execute periodical calibration or execute instant calibration according to the sampling period; as a result, the self-calibration method is more effective and practicable for calibrating the value of baseline capacitance and has better performance of resisting environmental noise interferences.

Figure 7:
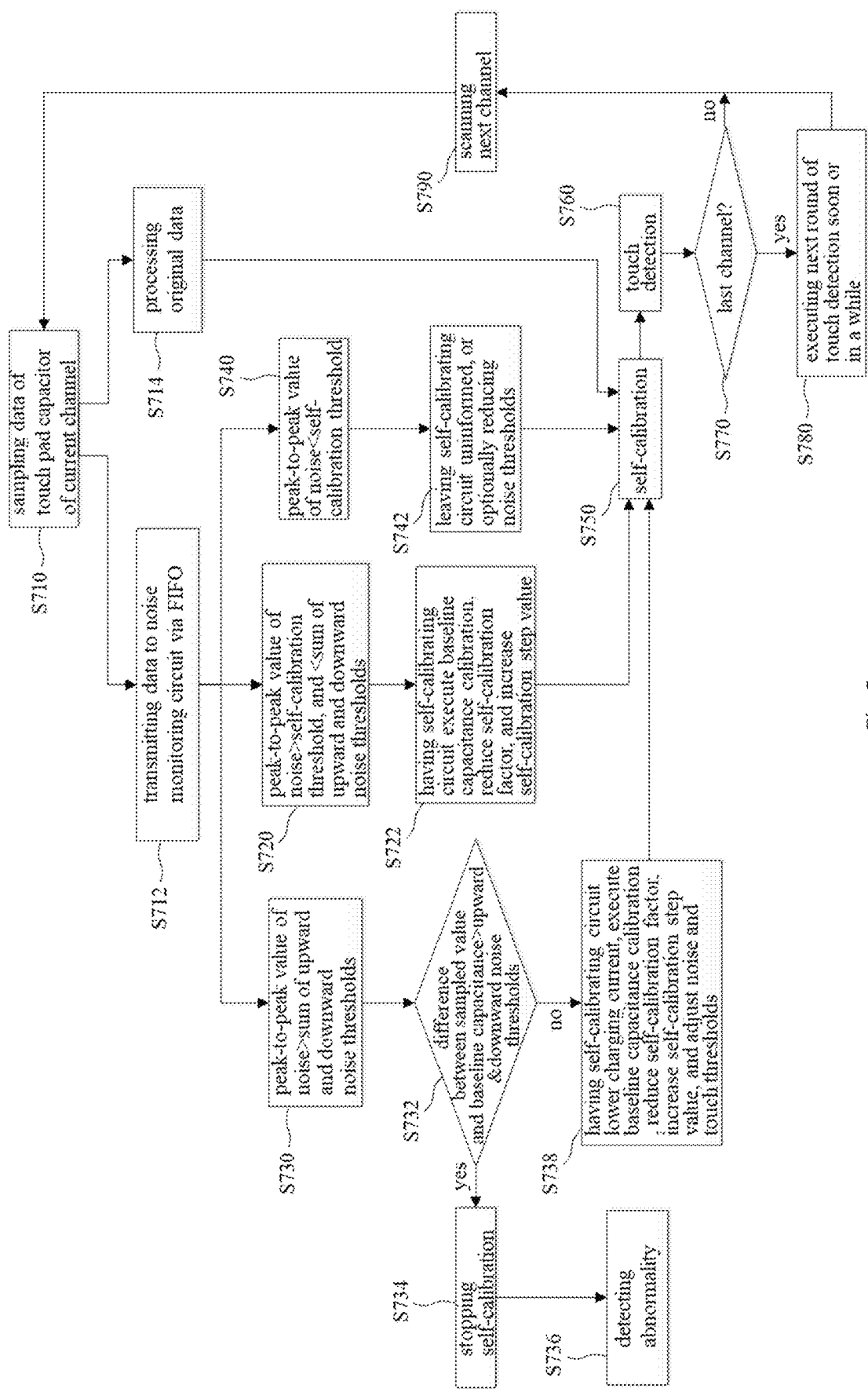
FIG. 7 shows a flowchart of an embodiment of composite self-calibration.

In an exemplary implementation, the self-calibrating circuit 350, the abnormality detecting circuit 340, and the noise monitoring circuit 360 execute a joint self-calibration method together (See step S645). FIG. 7 shows the flow chart of an embodiment of the joint self-calibration method including steps S710-S790, in which the steps S770-S790 are similar to the steps S650-S660. As shown in FIG. 7, the joint self-calibration method includes the features below. The self-calibrating circuit 350 includes a self-calibration threshold which could be 40%-80% of the noise threshold. In conjunction with the noise monitoring circuit 360, the self-calibrating circuit 350 executes adjustment in self-calibration parameters and automatic adjustment in the self-calibration of baseline capacitance for each channel, the touch threshold, the differential threshold, noise threshold, and charging current. During the sampling process (See step S710), the sampler circuit 120 transmits the original sample data to the noise monitoring circuit 360 (See step S712) via the arbitrator 130 and the FIFO 320. The noise monitoring circuit 360 monitors the peak-to peak value of noise and SNR according to the original sample data stored in the FIFO 320 so as to monitor the influence of environmental factors and electro-interference (See step S720). Based on the result of noise detection, when the data processing circuit 310 finishes processing its received data (See step S714), the data processing circuit 310 has the self-calibrating circuit 350 synchronously execute the dynamic adjustment in the self-calibration parameters, charging current, and thresholds in light of the calibration of baseline capacitance (See step S722).

Please refer to FIG. 7. The joint self-calibration method includes the features below. The noise monitoring circuit 360 calculates the peak-to-peak value of noise and SNR according to the original sample data from the FIFO 320. When the peak-to-peak value of noise obtained by sampling the voltage of the touch pad capacitor of a channel one time is smaller than the self-calibration threshold (See step S740), it implies that the current noise interference is smaller; accordingly, the self-calibrating circuit 350 executes the self-calibration of the value of baseline capacitance and the self-calibration of thresholds as usual, or optionally lowers the noise threshold (See step S742) to increase the stability of touch detection. When the peak-to-peak value is greater than the self-calibration threshold but smaller than the sum of the upward and downward noise thresholds (See step S720), it implies that the current noise interference goes up but falls within a normal range of noise; accordingly, before the execution of self-calibration, the noise monitoring circuit 360 not only requests the self-calibrating circuit 350 to execute the self-calibration of the value of baseline capacitance and the self-calibration of thresholds but also adjust the self-calibration parameters, reduce the self-calibration factor, and increase the self-calibration step value (See step S722) so that the execution of self-calibration can be quicker and the anti-interference characteristic can be enhanced. When the peak-to-peak value is greater than the sum of the upward and downward noise thresholds (See step S730) and the difference between the processed sample value of the data processing circuit 310 and the value of baseline capacitance is greater than the noise threshold (See step S732), the self-calibrating circuit 350 is requested to execute the self-calibration of the value of baseline capacitance and the self-calibration of thresholds, decrease the charging current for the current channel by a smallest predetermined amount, synchronously adjust the self-calibration parameters, decrease the self-calibration factor, and increase the self-calibration step value so as to offset the interference caused by the increasing noise, accelerate the response speed of the self-calibration process, and synchronously adjust the noise threshold and touch threshold (See step S738) to ensure the accuracy of touch detection. According to the result of comparing the processed data of the data processing circuit 310 with the value of baseline capacitance, when the polarity of the difference is labeled "0" and the difference between the sample value and the value of baseline capacitance is greater than the downward noise threshold or when the polarity of the difference is labeled "1" and the difference between the sample value and the value of baseline capacitance is greater than the upward noise threshold, the self-calibration process is stopped (See step S734) while the abnormality detecting circuit 340 takes over the detection (See step S736) to determine whether the digital number of the ADC 210 is eternally lower because of some abnormal circumstance such as the concerned touch pad being covered by an object or to determine whether the digital number of the ADC 210 is eternally higher because of some abnormal circumstance such as a reset operation being executed during the occurrence of a touch event which is soon released. When the digital number of the ADC 210 is eternally lower, the difference between the sample value and the value of baseline capacitance tends to being greater than the downward noise threshold; and when the digital number of the ADC 210 is eternally higher, the difference between the sample value and the value of baseline capacitance tends to being greater than the upward noise threshold; both of the above-mentioned two circumstances are abnormal.

On the basis of the above description, when the self-calibrating circuit 350 obtains data from the data processing circuit 310 for the execution of touch detection (See step S760) and self-calibration (See step S750), the abnormality detecting circuit 340 synchronously executes the abnormality detection. When the sample value approaches or reaches the range of the ADC 210, the self-calibrating circuit 350 has the charging current for the channel in concern be decreased till the sample value falls within a better/optimal detection region. An instance of the optimal detection region is 50%-90% of the range of the ADC 210.

In an exemplary implementation, the features of the aforementioned joint self-calibration include: the self-calibrating circuit 350 being capable of executing self-calibration for each channel individually.

It should be noted that people of ordinary skill in the art can implement the present invention by selectively using some or all of the features of any embodiment in this specification or selectively using some or all of the features of multiple embodiments in this specification as long as such implementation is practicable, which implies that the present invention can be carried out flexibly.

To sum up, the capacitive touch detecting device has the advantages of better anti-interference and lower hardware cost.

The aforementioned descriptions represent merely the preferred embodiments of the present invention, without any intention to limit the scope of the present invention thereto. Various equivalent changes, alterations, or modifications based on the claims of present invention are all consequently viewed as being embraced by the scope of the present invention.

What is claimed is:

1. A capacitive touch detecting device, comprising:
   a clock provider configured to provide a clock signal;
   a sampler circuit configured to
      charge a capacitor when a level of the clock signal is a first level, sample a capacitive voltage during a level transition of the clock signal to generate a sample value, and discharge the capacitor when the level of the clock signal is a second level, in which the capacitive voltage is determined by the capacitor, the capacitor is electrically coupled to one of touch pads, a capacitance of the capacitor is a first capacitance when a touch event occurs and the capacitance of the capacitor is a second capacitance when no touch event occurs, the first capacitance is greater than the second capacitance and related to a parasitic capacitance and a touch capacitance, the second capacitance is unrelated to the touch capacitance, and the clock signal changes from the first level to the second level during the level transition of the clock signal;
   a detection circuit configured to determine whether a touch condition is fulfilled according to the sample value and accordingly determine whether the touch event occurs; and
   a control circuit configured to control an operation of the clock provider, an operation of the sampler circuit, and an operation of the detection circuit,
   wherein the detection circuit is a partial circuit of a detection-and-calibration circuit included in the capacitive touch detecting device, and includes:
      a data processing circuit configured to process the sample value in a predetermined way and thereby generate at least one touch detection reference value; and
      a touch detecting circuit configured to determine whether the touch event occurs according to the at least one touch detection reference value and at least one setting value of the touch condition,
   wherein the detection-and-calibration circuit is configured to determine whether a calibration condition is fulfilled, and includes the detection circuit and a self-calibrating circuit that is configured to determine whether at least one parameter needs to be calibrated according to the at least one touch detection reference value and at least one setting value of the calibration condition.

2. The capacitive touch detecting device of claim 1, further comprising an arbitrator electrically coupled between the sampler circuit and the detection circuit, wherein the arbitrator is configured to output the sample value to at least one of the detection circuit and an external circuit.

3. The capacitive touch detecting device of claim 1, further comprising a register circuit configured to provide an initial value of at least one parameter for the detection circuit.

4. The capacitive touch detecting device of claim 1, wherein the sampler circuit includes:
   an adjustable current source configured to provide a charging current for charging the capacitor; and
   an analog-to-digital converter configured to convert the capacitive voltage into the sample value; and
   a voltage regulator configured to provide a stable voltage for the analog-to-digital converter.

5. The capacitive touch detecting device of claim 1, wherein the at least one parameter includes a capacitive setting value of the parasitic capacitance, and when the self-calibrating circuit determines to calibrate the at least one parameter, the self-calibrating circuit determines whether the at least one touch detection reference value reaches a self-calibration factor and accordingly determines whether the capacitive setting value needs to be updated with a step value.

* * * * *